United States Patent
Yoon et al.

(10) Patent No.: US 7,074,652 B2
(45) Date of Patent: Jul. 11, 2006

(54) METHOD FOR SEPARATING SAPPHIRE WAFER INTO CHIPS

(75) Inventors: Jeong Goo Yoon, Kyungki-do (KR); Bang Won Oh, Kyungki-do (KR); Kuk Hwea Yi, Seoul (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 280 days.

(21) Appl. No.: 10/806,433

(22) Filed: Mar. 23, 2004

(65) Prior Publication Data

US 2005/0079687 A1    Apr. 14, 2005

(30) Foreign Application Priority Data

Sep. 23, 2003   (KR) ...................... 10-2003-0066079

(51) Int. Cl.
*H01L 21/48* (2006.01)
*G03C 5/00* (2006.01)

(52) U.S. Cl. ...................... 438/113; 438/462; 430/313; 430/323

(58) Field of Classification Search ................ None
See application file for complete search history.

(56) References Cited

U.S. PATENT DOCUMENTS

| | | | |
|---|---|---|---|
| 5,759,087 A * | 6/1998 | Masumura et al. ........... 451/41 |
| 6,465,158 B1 | 10/2002 | Sekiya ....................... 430/313 |
| 6,593,170 B1 | 7/2003 | Tateiwa et al. ............. 438/114 |
| 2003/0008510 A1 * | 1/2003 | Grigg et al. ................ 438/692 |

FOREIGN PATENT DOCUMENTS

| | | | |
|---|---|---|---|
| JP | 10166259 A * | 6/1998 |
| JP | 2000-331965 | 11/2000 |
| KR | 1999-001788 | 1/1999 |

* cited by examiner

*Primary Examiner*—Alonzo Chambliss
(74) *Attorney, Agent, or Firm*—Lowe Hauptman & Berner, LLP.

(57) ABSTRACT

Disclosed is a method for efficiently separating a sapphire wafer serving as a substrate, on which semiconductor elements are formed, into unit chips by scribing the sapphire wafer, after grinding and lapping a rear surface of the sapphire wafer and then sand-blasting the sapphire wafer. The method includes the steps of: (a) grinding a rear surface of the sapphire wafer so that the sapphire wafer has a designated thickness; (b) lapping the rear surface of the ground sapphire wafer so that the sapphire wafer has a designated thickness; (c) polishing the rear surface of the lapped sapphire wafer so that the sapphire wafer has a designated thickness; (d) sand-blasting the rear surface of the polished sapphire wafer by uniformly blasting particles at a designated pressure during a designated time onto the rear surface of the polished sapphire wafer; and (e) scribing the rear surface of the sand-blast ground sapphire wafer.

8 Claims, 4 Drawing Sheets

METHOD FOR SEPARATING SAPPHIRE WAFER INTO CHIPS

BACKGROUND OF THE INVENTION

1. Field of the Invention

The present invention relates to a method for separating a sapphire wafer, adapted to manufacture a GaN semiconductor light emitting diode (LED), into chips, and more particularly to a method for separating a sapphire wafer into chips by scribing the sapphire wafer, after grinding, lapping and polishing a rear surface of the sapphire wafer and then sand-blasting the sapphire wafer, thus allowing the sapphire wafer to be efficiently scribed.

2. Description of the Related Art

Recently, LED displays, serving as visual information transmission media, starting from providing alpha-numerical data have been developed to provide various moving pictures such as CF images, graphics, video images, etc. Further, the LED displays have been developed so that light emitted from the displays is changed from a solid color into colors in a limited range using red and yellowish green LEDs and then into total natural colors using the red and yellowish green LEDs and a newly proposed GaN high-brightness blue LED. However, the yellowish green LED emits a beam having a brightness lower than those of the red and blue LEDs and a wavelength of 565 nm, which is unnecessary for displaying the three primary colors of light. Accordingly, with the yellowish green LED, it is impossible to substantially display the total natural colors. Thereafter, in order to solve the above problems, there has been produced a GaN high-brightness pure green LED, which emits a beam having a wavelength of 525 nm suitable for displaying the total natural colors. The LED display represents a high-quality screen displaying total natural colors having long life span, high brightness and high visibility in accordance with the development of the GaN semiconductor LEDs. Thereby, a large-scale color outdoor LED visual display having a size of 100 inches or more has been proposed, and then developed as an advanced visual information transmission medium, which is connected to a computer to improve a level of outdoor commercial advertisement and displays various visual real-time information including news.

When a blue or green GaN semiconductor LED employed by a color LED display is manufactured, a GaN single crystal is grown on a heterogeneous substrate by a vapor growth method such as an MOCVD (Metal Organic Chemical Vapor Deposition) or HVPE (Hydride Vapor Phase Epitaxy) method, or an MBE (Molecular Beam Epitaxy) method. Here, a sapphire ($\alpha$-$Al_2O_3$) substrate or a SiC substrate is used as the heterogeneous substrate. Particularly, the sapphire substrate is made of a crystal having Hexa-Rhombo (R3c) type symmetry, and has a lattice constant in a direction of a C-axis of 13.001 Å and a lattice distance in a direction of an A-axis of 4.765 Å. Orientation planes of sapphire substrate include a C (0001) plane, an A (1120) plane, an R (1102) plane, etc. Since the C plane of the sapphire substrate has a GaN thin film easily grown thereon, and is low-priced and stable at a low temperature, compared to the SiC substrate, the sapphire substrate is mainly used for the blue or green LED.

Generally, a GaN semiconductor LED comprises a sapphire substrate, a first conductive clad layer, an active layer and a second conductive clad layer. The first conductive clad layer, the active layer and the second conductive clad layer are sequentially formed on the sapphire substrate. The first conductive clad layer includes an n-type GaN layer and an n-type AlGaN layer, and the active layer includes an undoped InGaN layer having a multi-quantum well structure. The second conductive clad layer includes a p-type GaN layer and a p-type AlGaN layer. In order to improve lattice matching between the n-type GaN layer and the sapphire substrate, a buffer layer such as an AlN/GaN layer is formed on the sapphire substrate prior to the growth of the n-type GaN layer on the sapphire substrate. In order to form two electrodes on an upper surface of the sapphire substrate, which is an electrical insulator, the second conductive clad layer and the active layer are etched at a designated area so that an upper surface of the first conductive clad layer is selectively exposed to the outside, and a first electrode is formed on the exposed upper surface of the first conductive clad layer. Since the second conductive clad layer has a comparatively high resistance, an Ohmic contact layer is additionally formed on the upper surface of the second conductive clad layer and a second electrode is formed on an upper surface of the Ohmic contact layer. In an actual manufacturing process, a sapphire wafer is used as the sapphire substrate.

After the first conductive clad layer, the active layer, the second conductive clad later and the electrodes are formed on the sapphire wafer as described above, the sapphire wafer is separated into individual semiconductor chips. Here, since sapphire is a very solid material (having mohs hardness of 9) in physiochemical properties, the rear surface of the sapphire wafer is ground, lapped and polished so that the thickness of the sapphire wafer is reduced, and is then scribed into individual chips using a diamond tip. Thereby, the sapphire wafer is separated into the chips.

FIGS. 1a to 1c are schematic views illustrating a conventional process for separating a sapphire wafer into chips. FIG. 1a shows a grinding step. As shown in FIG. 1a, a rear surface of a sapphire wafer 10 is ground so as to have a designated thickness (for example, 115 μm) using a rotating diamond wheel 11. Then, as shown in FIG. 1b, the ground sapphire wafer 10 is lapped and polished. In a lapping step, the sapphire wafer 10 is mounted on a lapping plate 12 and then ground so as to have a designated thickness (for example, 81 μm) using a diamond slurry 13 having a particle size of 6 μm. After the lapping of the sapphire wafer 10, as shown in FIG. 1b, the sapphire wafer 10 is polished so as to have a designated thickness (for example, 80 μm) using a diamond slurry 13 having a particle size of 3 μm. Then, as shown in FIG. 1c, the polished sapphire wafer 10 is scribed and separated into a plurality of chips using a diamond tip 14.

In the above-described conventional method for separating the sapphire wafer into the chips, since the polished sapphire wafer has a low surface roughness (Ra) and a low stress, the surface of the polished sapphire wafer is not easily scribed using the diamond tip. That is, since the diamond tip skids on the surface of the sapphire wafer, it is difficult to precisely scribe the sapphire wafer using the diamond tip. The difficulty in precisely scribing the sapphire wafer using the diamond tip causes cracks on chips separated from the sapphire wafer as shown in FIGS. 4a and 4b, thus generating defects in the shape of the chips and reducing yield of the chips. Particularly, the conventional method for separating the sapphire wafer into the chips increases the quantity of abrasion of the expensive diamond tip, thus reducing productivity in manufacturing the chips and increasing unit cost of obtained chip products.

Accordingly, there is required a method for separating a sapphire wafer into chips, which prevents defects in the shape of the obtained chips separated from the sapphire wafer and reduces the quantity of abrasion of the expansive diamond tip.

SUMMARY OF THE INVENTION

Therefore, the present invention has been made in view of the above problems, and it is an object of the present invention to provide a method for separating a sapphire wafer serving as a substrate, provided with semiconductor elements such as LEDs formed thereon, into chips, in which the sapphire wafer is easily and efficiently scribed by controlling stress on the rear surface of the sapphire wafer, thus preventing defects in the shape of the obtained chips and reducing the quantity of abrasion of an expensive diamond tip.

In accordance with the present invention, the above and other objects can be accomplished by the provision of a method for separating a sapphire wafer serving as a substrate, on which semiconductor elements are formed, into unit chips, comprising the steps of: (a) grinding a rear surface of the sapphire wafer so that the sapphire wafer has a designated thickness; (b) lapping the rear surface of the ground sapphire wafer so that the sapphire wafer has a designated thickness; (c) polishing the rear surface of the lapped sapphire wafer so that the sapphire wafer has a designated thickness; (d) sand-blasting the rear surface of the polished sapphire wafer by uniformly blasting particles at a designated pressure during a designated time onto the rear surface of the polished sapphire wafer; and (e) scribing the rear surface of the sand-blast ground sapphire wafer.

Preferably, the sapphire wafer in the step (d) may be warped such that a central portion of the rear surface of the sapphire wafer is higher than an edge portion of the rear surface of the sapphire wafer by a height of 1.5 mm to 2.5 mm.

Further, preferably, the particles in the step (d) may be made of one material selected from the group consisting of silundum (SiC), boron carbide ($B_4C$) and aluminum oxide ($Al_2O_3$), and have a diameter of 5 µm to 50 µm, a blast time of less than 5 minutes and a blast pressure of 3 kg/cm² to 5 kg/cm².

Moreover, preferably, the rear surface of the ground sapphire wafer in the step (d) may be ground such that the sapphire wafer has a thickness reduced by 2 µm to 14 µm, and a surface roughness of less than 0.013 µm.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Now, preferred embodiments of the present invention will be described in detail with reference to the annexed drawings.

Figure 1:
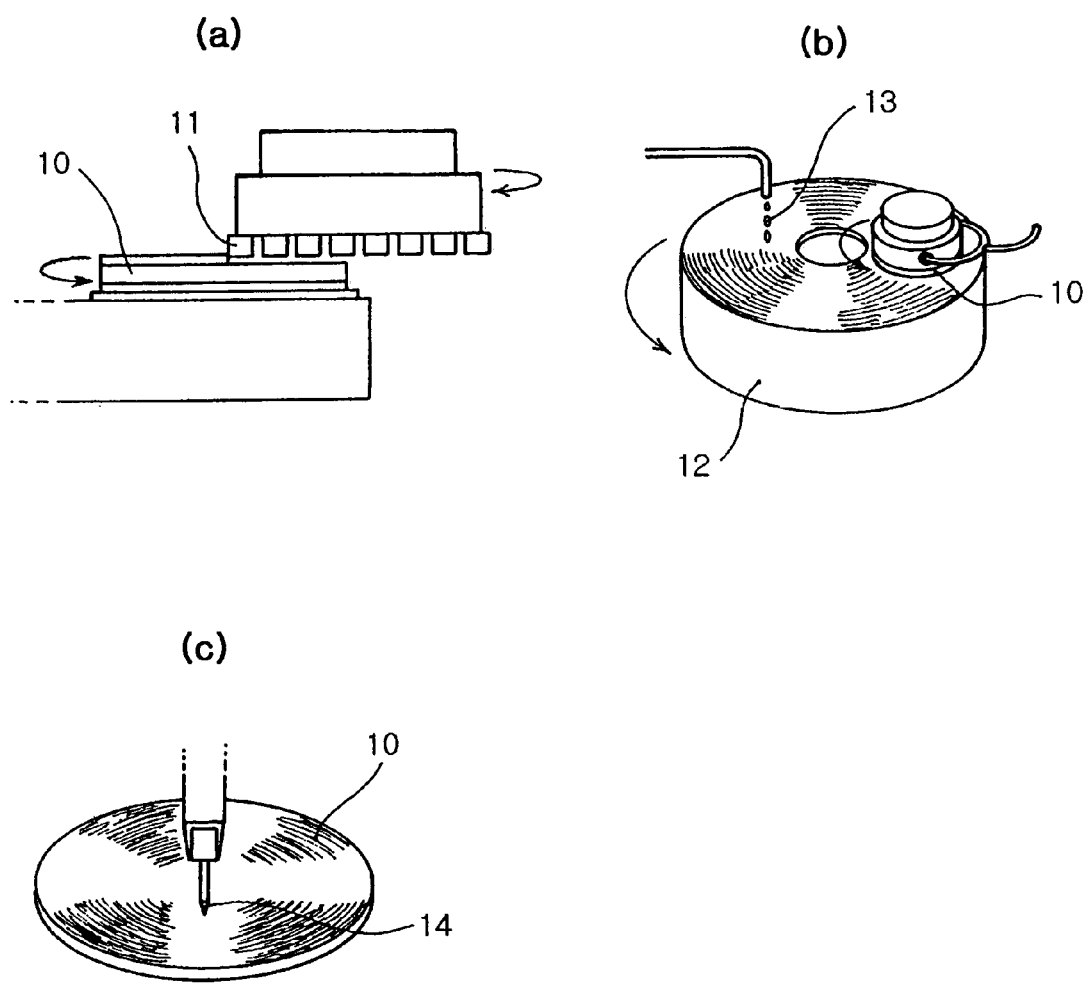
FIGS. 1a to 1c are schematic views illustrating a conventional method for separating a sapphire wafer into chips.
Figure 2:
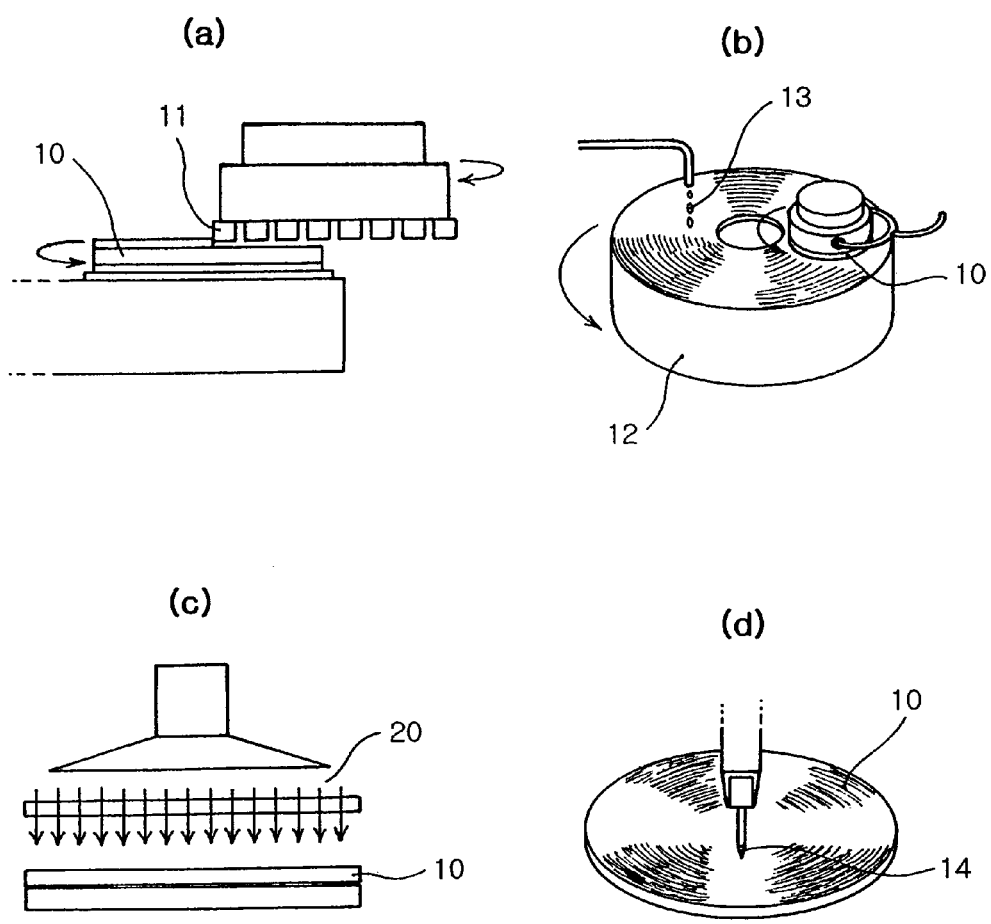
FIGS. 2a to 2d are schematic views illustrating a method for separating a sapphire wafer into chips in accordance with the present invention.

FIGS. 2a to 2d are schematic views illustrating a method for separating a sapphire wafer 10 into chips in accordance with the present invention. As shown in FIG. 2a, a rear surface of the sapphire wafer 10 is ground using a rotating diamond wheel 11 so that the sapphire wafer 10 has a designated thickness (for example, 115 µm).

As shown in FIG. 2b, the ground sapphire wafer 10 is lapped and polished. In the lapping step, the ground sapphire wafer 10 is mounted on a lapping plate 12, and then ground using a diamond slurry 13 having a particle size of 6 µm so that the sapphire wafer 10 has a designated thickness (for example, 8 µm). After the lapping step, the sapphire wafer 10 is polished using a diamond slurry 13 having a particle size of 3 µm smaller than the particle size of the diamond slurry 13 used in the lapping step in the same manner as the lapping step so that the sapphire wafer 10 has a designated thickness (for example, 80 µm).

The polishing step is performed in order to obtain transparency of the sapphire wafer 10. Since the rear surface of the sapphire wafer 10 is ground using the diamond slurry 13 having a fine particle size, the polishing step reduces surface roughness (Ra) and stress of the rear surface of the sapphire wafer 10. In a scribing step of scribing the polished rear surface of the sapphire wafer 10, since the stress on the polished rear surface of the sapphire wafer 10 is reduced, the sapphire wafer 10 is not easily scribed with a diamond tip.

Figure 3:
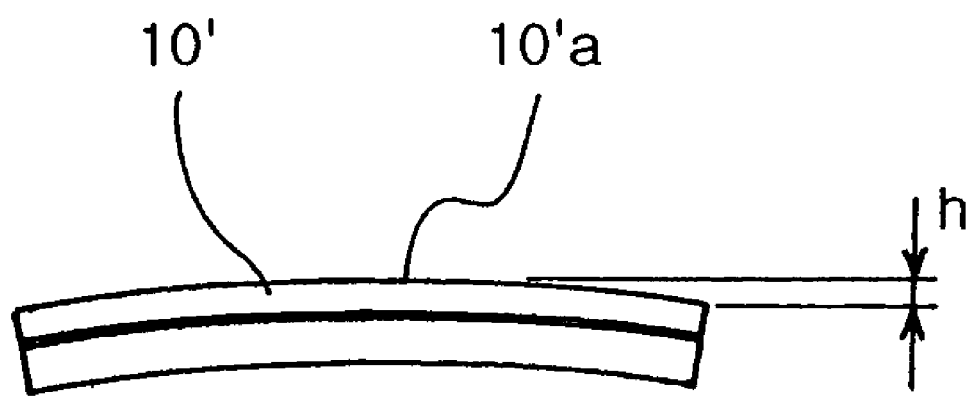
FIG. 3 is a schematic view of the sapphire wafer after application of a sand-blasting method employed by the present invention.

In order to solve the above problem, as shown in FIG. 2c, designated particles 20 are blasted onto the polished rear surface of the sapphire wafer 10 using a sand-blasting method so that the sapphire wafer 10 is warped at a designated degree, thus increasing stress on the rear surface of the sapphire wafer 10. FIG. 3 is a schematic view of the sapphire wafer after application of the sand-blasting method. As shown in FIG. 3, when a rear surface 10'a of a polished sapphire wafer 10' is sand-blast ground, the polished sapphire wafer 10' is warped such that the sand-blast ground surface (i.e. the sand-blast ground rear surface 10'a of the sapphire wafer 10') is bent outward. Preferably, the polished sapphire wafer 10' is warped to a designated degree such that a difference of heights (h) between a central portion and an edge portion of the rear surface 10'a is in the range of 1.5 mm to 2.5 mm. The warpage of the sapphire wafer 10' increases stress on the rear surface 10'a of the sapphire wafer 10', thus allowing the rear surface 10'a of the sapphire wafer 10' to be easily scribed in the following scribing step.

Generally, in the sand-blasting method, particles having a designated hardness are blasted onto a work material at a high pressure so as to grind the work material. Grinding results of the work material is controlled by kind, size, blast pressure and blast time of the used particles.

Preferably, the particles used by the sand-blasting method employed by the present invention are made of one material selected from the group consisting of silundum (SiC), boron carbide ($B_4C$) and aluminum oxide ($Al_2O_3$). Generally, silundum is mainly used as the particles of the sand-blasting method. Since sapphire is a material having a high hardness (mohs hardness of 9), it is preferable that particles are made of a material having a hardness higher than that of the silundum in order to grind the sapphire wafer. The particles are made of, more preferably, boron carbide or aluminum oxide, and most preferably, aluminum oxide.

Table 1 illustrates results of a test in which the sand-blasting method using particles made of aluminum oxide is applied to a sapphire wafer according to variation in diameter and blast pressure of the particles.

TABLE 1

| Diameter of Particle (μm) | Blast pressure (kg/cm²) | Reduced thickness (μm/5 mins) | Surface roughness Ra(μm) |
|---|---|---|---|
| 5 | 3 | 2 | 0.0014 |
|  | 4 | 2 | 0.0012 |
|  | 5 | 3 | 0.0015 |
| 20 | 3 | 6 | 0.0062 |
|  | 4 | 8 | 0.0047 |
|  | 5 | 8 | 0.0055 |
| 50 | 3 | 13 | 0.0091 |
|  | 4 | 13 | 0.0075 |
|  | 5 | 14 | 0.0122 |
| 80 | 3 | 19 | 0.0129 |
|  | 4 | 21 | 0.0215 |
|  | 5 | 22 | 0.0287 |
| 120 | 3 | 28 | 0.0714 |
|  | 4 | 29 | 0.0882 |
|  | 5 | 33 | 0.0916 |

With reference to Table 1, in case that the particles have a diameter of less than 5 μm, the sand-blasting method cannot provide sufficient warpage to the sapphire wafer. On the other hand, in case that the particles have a diameter of more than 50 μm, the sand-blasting method excessively decreases the thickness of the sapphire wafer, and excessively increases the surface roughness of the sapphire wafer, thus deteriorating transparency of the sapphire wafer. In case that the particles have a blast pressure of less than 3 kg/cm², the sand-blasting method cannot provide sufficient warpage to the sapphire wafer. On the other hand, in case that the particles have a blast pressure of more than 5 kg/cm², the sand-blasting method excessively decreases the thickness of the sapphire wafer, and excessively increases the surface roughness of the sapphire wafer, thus deteriorating transparency of the sapphire wafer. In case that the blast time of the particles is more than 5 minutes, the sand-blasting method excessively decreases the thickness of the sapphire wafer, and excessively increases the surface roughness of the sapphire wafer, thus deteriorating transparency of the sapphire wafer.

Accordingly, preferably, the particles used in the sand-blasting method employed by the present invention have a diameter of 5 μm to 50 μm, a blast pressure of 3 kg/cm² to 5 kg/cm², and a blast time of less than 5 minutes. Further, preferably, the sapphire wafer is ground by the sand-blasting method such that the sapphire wafer is reduced by a thickness of 2 μm to 14 μm and has its rear surface roughness (Ra) of less than 0.013 μm.

After the rear surface of the sapphire wafer 10 is sand-blast ground under the above-described conditions, the rear surface of the sapphire wafer 10 is scribed and separated into chips using a diamond tip 14 as shown in FIG. 2d. As described above, the surface of the polished sapphire wafer has an excessively low stress thereon. That is, since the surface of the polished sapphire wafer has a weak resistance against the diamond tip 14, the surface of the polished sapphire wafer is not easily scribed with the diamond tip 14. On the other hand, in case that the sapphire wafer is warped by the sand-blasting method, the surface of the warped sapphire wafer has an increased stress thereon, thus being easily and precisely scribed with the diamond tip.

Figure 4:
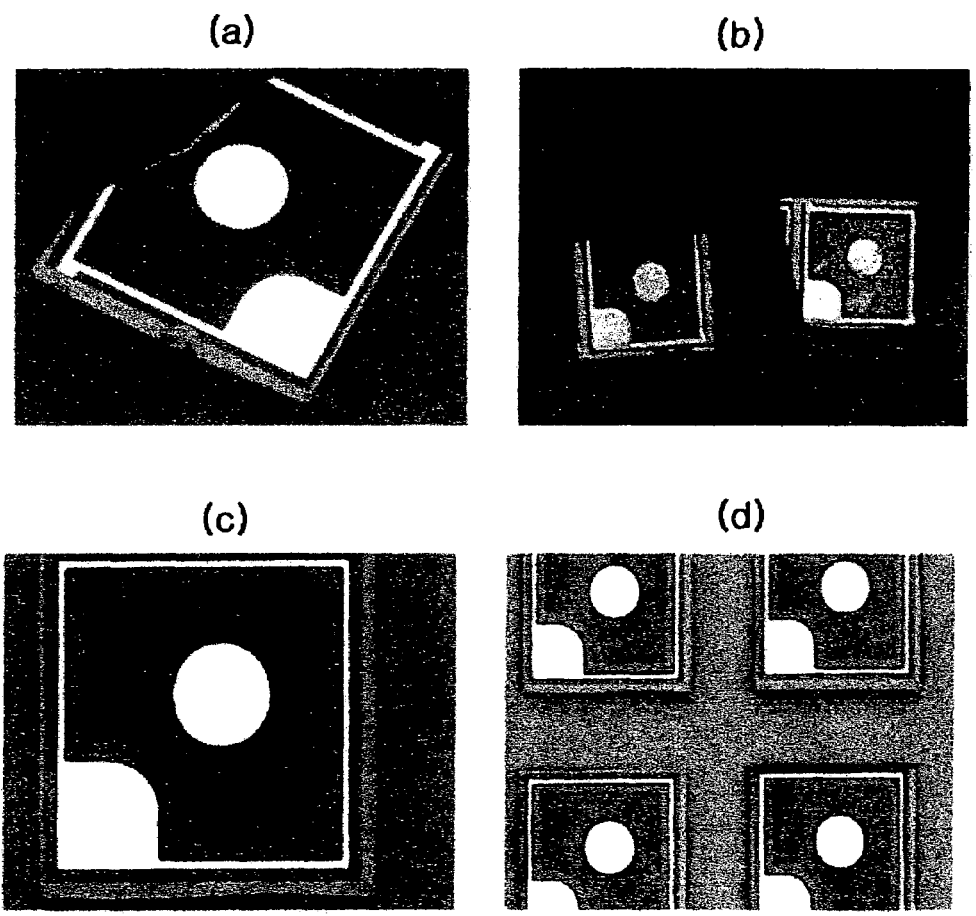
FIGS. 4a to 4d are photographs comparatively showing the chips separated from the sapphire wafers in accordance with the conventional method and the method of the present invention, respectively.

FIGS. 4a to 4d are photographs comparatively showing the chips separated from the sapphire wafers in accordance with the conventional method and the method of the present invention, respectively. FIGS. 4a and 4b are photographs of the chips separated from the sapphire wafer in accordance with the conventional method, and show that the chips separated from the sapphire wafer are partially broken and edges of the chips separated from the sapphire wafer are not clean. On the other hand, FIGS. 4c and 4d are photographs of the chips separated from the sapphire wafer in accordance with the method of the present invention, and show that the chips are perfectly separated form the sapphire wafer and edges of the chips separated from the sapphire wafer are clean.

Failure in the scribing of the sapphire wafer into the chips causes defects in the shape of the chips separated from the sapphire wafer as shown in FIGS. 4a and 4b, and increases the quantity of abrasion of the diamond tip used in the scribing step. The method for separating the sapphire wafer into the chips in accordance with the present invention prevents the chips separated from the sapphire wafer from having defective shapes, and reduces the quantity of abrasion of the diamond tip, which is an expensive piece of equipment, thus decreasing unit cost of chip products and improving productivity in manufacturing the chip products.

As apparent from the above description, the present invention provides a method for separating a sapphire wafer serving as a substrate, provided with semiconductor elements formed thereon, into chips by means of scribing, in which a rear surface of the sapphire wafer is ground, lapped, polished and then sand-blast ground, thus increasing stress on the rear surface of the sapphire wafer and allowing the sapphire wafer to be easily and efficiently scribed. Accordingly, the method of the present invention prevents defects in the shape of the obtained chips so as to improve yield of the chips, and reduces the quantity of abrasion of an expensive diamond tip so as to reduce unit cost of the chip products, thus increasing productivity in manufacturing the chip products.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for separating a sapphire wafer serving as a substrate, on which semiconductor elements are formed, into unit chips, comprising the steps of:
    (a) grinding a rear surface of the sapphire wafer so that the sapphire wafer has a designated thickness;
    (b) lapping the rear surface of the ground sapphire wafer so that the sapphire wafer has a designated thickness;
    (c) polishing the rear surface of the lapped sapphire wafer so that the sapphire wafer has a designated thickness;
    (d) sand-blasting the rear surface of the polished sapphire wafer by uniformly blasting particles at a designated pressure during a designated time onto the rear surface of the polished sapphire wafer; and
    (e) scribing the rear surface of the sand-blast ground sapphire wafer.

2. The method as set forth in claim 1,
    wherein the sapphire wafer in the step (d) is warped such that a central portion of the rear surface of the sapphire wafer is higher than an edge portion of the rear surface of the sapphire wafer by a height of 1.5 mm to 2.5 mm.

3. The method as set forth in claim 1,
wherein the particles in the step (d) are made of one material selected from the group consisting of silundum (SiC), boron carbide ($B_4C$) and aluminum oxide ($Al_2O_3$).

4. The method as set forth in claim 1,
wherein the particles in the step (d) have a diameter of 5 μm to 50 μm.

5. The method as set forth in claim 1,
wherein blast time of the particles in the step (d) is less than 5 minutes.

6. The method as set forth in claim 1,
wherein blast pressure of the particles in the step (d) is 3 $kg/cm^2$ to 5 $kg/cm^2$.

7. The method as set forth in claim 1,
wherein the thickness of the sapphire wafer in the step (d) is reduced by 2 μm to 14 μm.

8. The method as set forth in claim 1,
wherein the rear surface of the ground sapphire wafer in the step (d) is ground so as to have a surface roughness of less than 0.013 μm.

* * * * *